(12) United States Patent
Yanagisawa et al.

(10) Patent No.: US 8,350,392 B2
(45) Date of Patent: Jan. 8, 2013

(54) SEMICONDUCTOR DEVICE HAVING RECESS WITH VARYING WIDTH AND METHOD OF MANUFACTURING THE SAME

(75) Inventors: Hirotomo Yanagisawa, Kanagawa (JP); Kinya Otani, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 227 days.

(21) Appl. No.: 12/689,680

(22) Filed: Jan. 19, 2010

(65) Prior Publication Data
US 2010/0181688 A1    Jul. 22, 2010

(30) Foreign Application Priority Data
Jan. 21, 2009   (JP) .................................. 2009-010659

(51) Int. Cl.
*H01L 23/31*   (2006.01)
(52) U.S. Cl. ................................. 257/787; 257/E23.116
(58) Field of Classification Search .................. 257/787, 257/E23.116, E23.124, E23.131
See application file for complete search history.

(56) References Cited

U.S. PATENT DOCUMENTS

| | | | |
|---|---|---|---|
| 6,245,596 B1 * | 6/2001 | Kosaki et al. | 438/114 |
| 6,534,845 B1 * | 3/2003 | Yamada et al. | 257/669 |
| 2007/0267757 A1 * | 11/2007 | Nakagawa | 257/778 |

FOREIGN PATENT DOCUMENTS

| | | |
|---|---|---|
| JP | 63-106133 U | 7/1988 |
| JP | 3-57249 A | 3/1991 |
| JP | 3-153049 A | 7/1991 |
| JP | 6-53271 A | 2/1994 |
| JP | 6-163755 A | 6/1994 |
| JP | 7-201906 A | 8/1995 |

\* cited by examiner

*Primary Examiner* — Wensing Kuo
(74) *Attorney, Agent, or Firm* — Foley & Lardner LLP

(57) ABSTRACT

A semiconductor device includes a semiconductor chip, and an encapsulation resin which covers and encapsulates the semiconductor chip, the semiconductor chip having a recess formed in the surficial portion thereof; the recess having, on the deeper side than a predetermined portion thereof, a portion having a larger width than the predetermined portion has; and the encapsulation resin being anchored in the recess.

11 Claims, 8 Drawing Sheets

PRIOR ART

SEMICONDUCTOR DEVICE HAVING RECESS WITH VARYING WIDTH AND METHOD OF MANUFACTURING THE SAME

This application is based on Japanese patent application No. 2009-010659 the content of which is incorporated hereinto by reference.

BACKGROUND

1. Technical Field

The present invention relates to a semiconductor device and a method of manufacturing the same.

2. Related Art

Semiconductor device having a semiconductor chip, and an encapsulation resin which covers and encapsulates the semiconductor chip, is referred to as resin-encapsulated semiconductor device.

FIG. 17 is a front elevation illustrating a resin-encapsulated semiconductor device 101. As illustrated in FIG. 17, resin-encapsulated semiconductor device 101 is configured to have a semiconductor chip embedded in an encapsulation resin 103.

In this sort of semiconductor device, a problem may arise in that adhesiveness between the semiconductor chip and the encapsulation resin may degrade.

One possible cause for the degraded adhesiveness is ascribable to tensile stress applied in the direction of drawing the semiconductor chip and the encapsulation resin apart from each other, due to difference in thermal expansion coefficient therebetween. The stress generates typically due to heat applied to a semiconductor device when it is mounted by soldering onto a substrate of electric appliances and so forth, self-heating of the semiconductor device during operation, changes in the ambient temperature, and so forth.

There is known a technique of providing a countermeasure for the degradation in the adhesiveness between the semiconductor chip and the encapsulation resin, such as disclosed in Japanese Laid-Open Patent Publication No. H06-163755.

In the technique disclosed in Japanese Laid-Open Patent Publication No. H06-163755, a surface-textured component having a surface texture formed on the surface thereof is provided on a semiconductor chip, and resin encapsulation is provided thereover. Since the semiconductor chip and the encapsulation resin are tightly bonded while placing the surface-textured component in between, by virtue of the enlarged contact area between the surface-textured component and the encapsulation resin, so that the adhesiveness between the semiconductor chip and the encapsulation resin improves. Japanese Laid-Open Patent Publication No. H6-163755 additionally describes that the adhesiveness may be improved also by configuring the surface-textured component using an organic coverage resin such as polyimide.

However, the present inventors have found the following problem. FIG. 18 is a front elevation illustrating a state of a semiconductor device 101 warped due to the stress. FIG. 19 is a front elevation illustrating the resin-encapsulated semiconductor device 101 illustrated in FIG. 18, in a state having an encapsulation resin 103 removed therefrom. As illustrated in FIG. 19, there is a semiconductor chip 102 having been embedded in the encapsulation resin 103. The semiconductor chip 102 is disposed on a lead frame 104 having leads 5.

The resin-encapsulated semiconductor device 101 may occasionally warp, upon being applied with stress, as illustrated in FIG. 18 and FIG. 19. The warping may raise tensile stress in the direction of drawing the semiconductor chip 102 and the encapsulation resin 103 apart from each other. In other words, a stress generates in the direction normal to the surface of the semiconductor chip 102.

However, the surface-textured component disclosed in Japanese Laid-Open Patent Publication No. H6-163755 merely has recesses formed vertically to the surface of the semiconductor chip, or formed so as to widen themselves towards the opening end. Accordingly, a problem still remains in that the semiconductor chip, applied with the stress in the direction normal to the surface thereof, may cause degradation in the adhesiveness between the encapsulation resin and the recesses, and may consequently cause degradation in the adhesiveness between the encapsulation resin and the semiconductor chip. In conclusion, the technique disclosed in the patent publication is not sufficient in the effect of enhancing the adhesiveness between the semiconductor chip and the encapsulation resin.

SUMMARY

According to the present invention, there is provided a semiconductor device which includes a semiconductor chip; and an encapsulation resin which covers and encapsulates the semiconductor chip. The semiconductor chip has a recess formed in the surficial portion thereof. The recess has, on the deeper side than a predetermined portion thereof, a portion having a larger width than the predetermined portion has. The encapsulation resin is anchored in the recess.

In the semiconductor device, the recess is formed in the surficial portion of the semiconductor chip, and the recess has, on the deeper side than a predetermined portion thereof, a portion having a larger width than the predetermined portion has. In other words, the profile of the recess is such as resisting against force, which is exerted so as to draw the semiconductor chip and the encapsulation resin apart from each other, in the direction normal to the surface of the semiconductor chip. Anchoring of the encapsulation resin into the recess makes the encapsulation resin and the semiconductor chip engage with each other. Since a large bonding force between the semiconductor chip and the encapsulation resin may be obtained, the adhesiveness between the semiconductor chip and the encapsulation resin may be improved. More specifically, a performance of ensuring a sufficient level of adhesiveness between the semiconductor chip and the encapsulation resin may particularly be enhanced, even if the stress is exerted in the direction normal to the surface of the semiconductor chip.

According to the present invention, there is also provided a method of manufacturing a semiconductor device which includes: forming a recess in the surficial portion of a semiconductor chip; and encapsulating the semiconductor chip with an encapsulation resin. In the step of formation of the recess, the recess having, on the deeper side than a predetermined portion thereof, a portion having a larger width than the predetermined portion has, is formed. In the step of encapsulation with an encapsulating resin, the encapsulation resin and the semiconductor chip are engaged with each other by anchoring the encapsulation resin into the recess.

According to the present invention, the adhesiveness between the semiconductor chip and the encapsulation resin of the semiconductor device may be improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
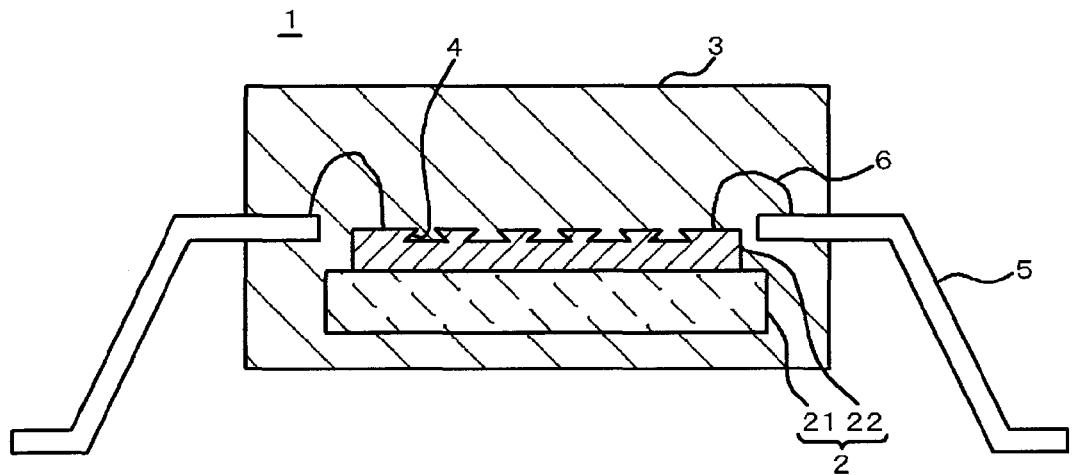
FIG. 1 is a front sectional view illustrating a configuration of a semiconductor device of a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituent in all drawings will be given identical reference numerals, and explanations therefor will not be repeated.

FIRST EMBODIMENT

Figure 2:
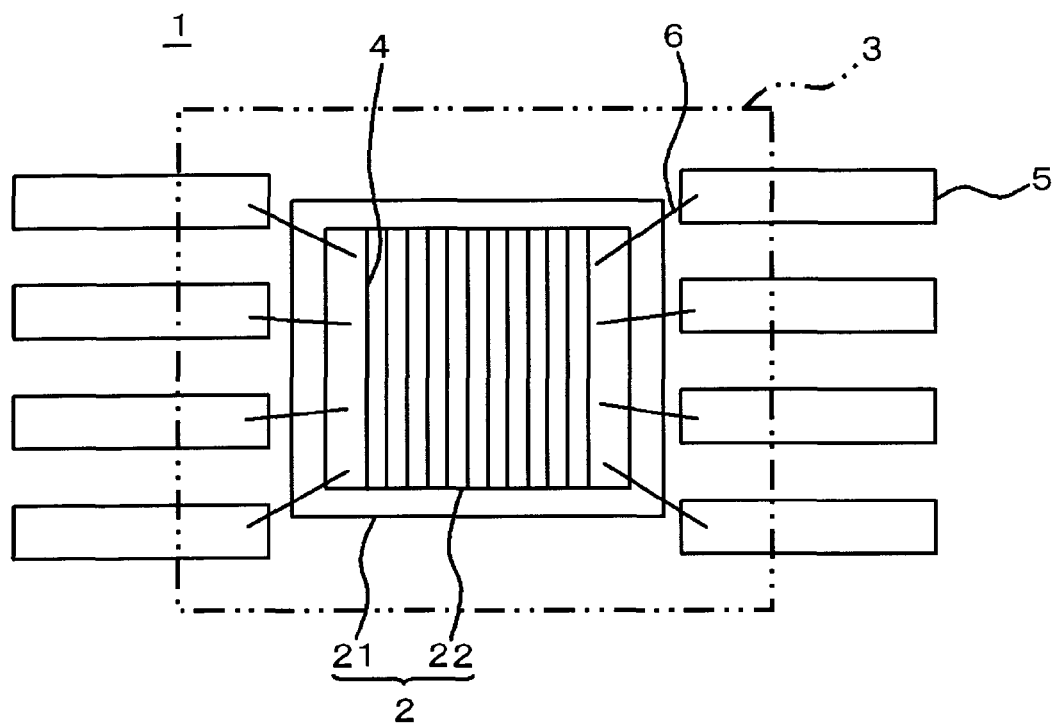
FIG. 2 is a plan view illustrating the semiconductor device of the first embodiment.
Figure 3:
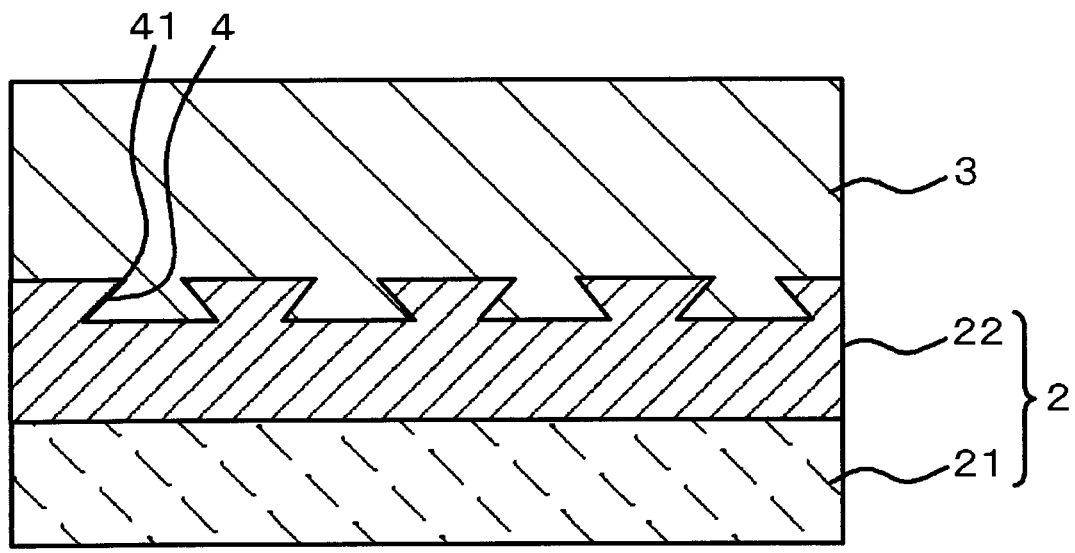
FIG. 3 is an enlarged view illustrating an essential portion of FIG. 1.

FIG. 1 is a front sectional view illustrating a configuration of a semiconductor device of a first embodiment, FIG. 2 is a plan view illustrating the semiconductor device of the first embodiment, and FIG. 3 is an enlarged view illustrating an essential portion of FIG. 1. In FIG. 2, an outline of the encapsulation resin 3 is indicated by a virtual line, so as to allow seeing through of the internal structure which is actually not recognizable due to an encapsulation resin 3 covering therearound.

A semiconductor device 1 of this embodiment has a semiconductor chip 2, and an encapsulation resin 3 which covers and encapsulates the semiconductor chip 2, wherein the semiconductor chip 2 has recesses 4 formed in a surficial portion thereof. Each recess 4 has, on the deeper side than a predetermined portion thereof, a portion having a larger width than the predetermined portion has, and the encapsulation resin 3 is anchored in each recess 4. A method of manufacturing a semiconductor device includes: forming recesses 4 in the surficial portion of a semiconductor chip 2; and encapsulating the semiconductor chip 2 with an encapsulation resin. In the step of forming the recesses 4, each recess 4 is formed so as to have, on the deeper side than a predetermined portion thereof, a portion having a larger width than the predetermined portion has. In the step of encapsulating with an encapsulating resin 3, the encapsulation resin 3 and the semiconductor chip 2 are engaged with each other by anchoring the encapsulation resin 3 into the recesses 4.

Details will be given below.

First, a structure of the semiconductor device 1 will be explained.

As illustrated in FIG. 1 and FIG. 2, the semiconductor device 1 has the semiconductor chip 2, the encapsulation resin 3 which covers and encapsulates the semiconductor chip 2, leads 5, and wires 6 which electrically connect the leads 5 and the semiconductor chip 2. The semiconductor chip 2 has a semiconductor substrate 21, and a surface electrode 22 which is formed over the semiconductor substrate 21. More specifically, the semiconductor chip 2 has the surface electrode 22 in the surficial portion thereof.

In the surficial portion of the semiconductor chip 2, the recesses 4 are formed. In this embodiment, as illustrated in FIG. 1, the recesses 4 are formed in the surficial portion of the surface electrode 22.

The surface electrode 22 is composed of a metal layer. Metal material composing the surface electrode 22 may be exemplified by aluminum, copper, aluminum-copper alloy (AlCu), aluminum-silicon-copper alloy (AlSiCu) and so forth.

In this embodiment, as illustrated in FIG. 3, each recess 4 is formed so as to have, over the entire portion thereof, a reversely-tapered profile which increases in the width towards the deeper side.

Accordingly, each recess 4 in this embodiment satisfies the condition stating that "on the deeper side than a predetermined portion in the recess 4, a portion having a larger width than the predetermined portion has is formed". This is because all portions except for the bottom portion of each recess 4 may be understood as the "predetermined portion".

In addition, each recess 4 in this embodiment also satisfies the condition stating that "the recess 4 has the portion having a larger width than an opening end 41 has, on the deeper side than the opening end 41".

The recesses 4 are formed into an oblong geometry, and extend in parallel with each other over the surface of the semiconductor chip 2, typically as illustrated in FIG. 2. The geometry is, however, not limited to the illustrated example, allowing any other spot-wise arrangement (according to a matrix, for example) of the recesses 4.

Only a single recess 4 may be good enough, but a plurality of the recesses 4 are more preferable.

The recesses 4 are preferably formed in the region along the circumferential portion of the semiconductor chip 2. This is because the circumferential portion is where a particularly strong adhesiveness is desired.

Each recess 4 has the encapsulation resin 3 anchored and cured therein, so that the encapsulation resin 3 and the semiconductor chip 2 are engaged with each other. As a consequence, the adhesiveness between the encapsulation resin 3 and the semiconductor chip 2 is enhanced.

The encapsulation resin 3 herein is typically composed of an epoxy resin, such as that of Novolac-base, added with approximately 80% by weight of silica.

Next, the method of manufacturing the semiconductor device of this embodiment will be explained. FIG. 4 to FIG. 9 are series of sectional views for explaining the method of manufacturing, respectively illustrating structures of the sectional end faces.

Figure 4:
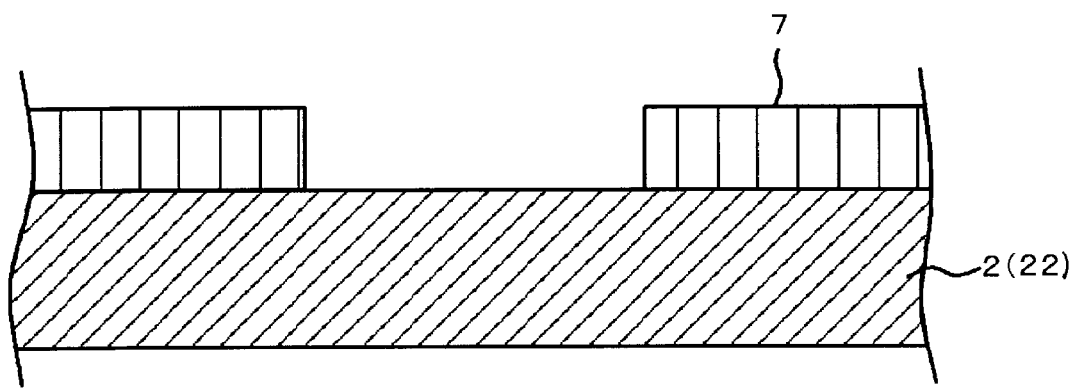
FIG. 4 to FIG. 9 are a series of sectional views for explaining a method of manufacturing the semiconductor device of the first embodiment.

First, as illustrated in FIG. 4, a mask pattern 7 is formed over the surface electrode 22 of the semiconductor chip 2. The mask pattern 7 herein may be a resist pattern formed by a photolithographic process, or may be a hard mask formed by a photolithographic process combined with etching.

The geometry of opening of each recess 4 may be transferred from the geometry of opening of the mask pattern 7.

The geometry of opening of the mask pattern 7 is, therefore, determined depending on a desired geometry of opening of each recess 4.

Next, the surface electrode 22 is etched using the mask pattern 7 as a mask, to thereby form the recesses 4 in the surficial portion of the surface electrode 22.

By appropriately adjusting the conditions, the etching herein is allowed to proceed in an isotropic mode, particularly so as to allow an etching product to deposit on the inner circumference of the recesses 4 as soon as the etching starts. The etching is preferably proceeded by dry etching with the aid of an etching gas.

Figure 5:
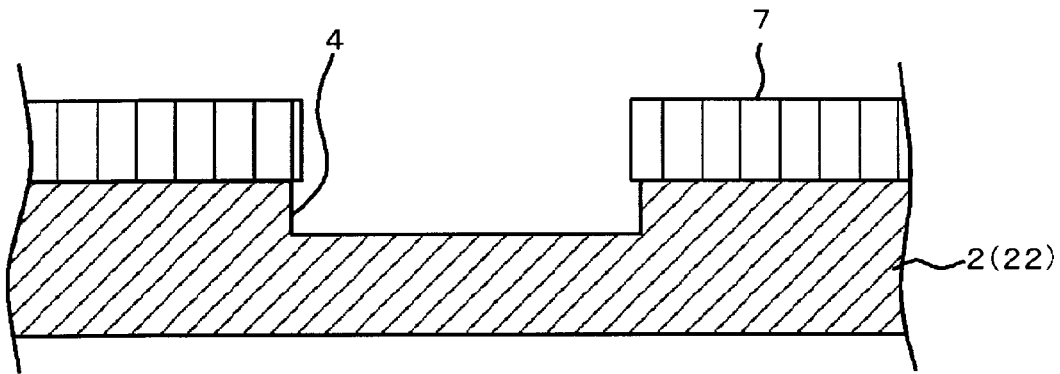
Figure 6:
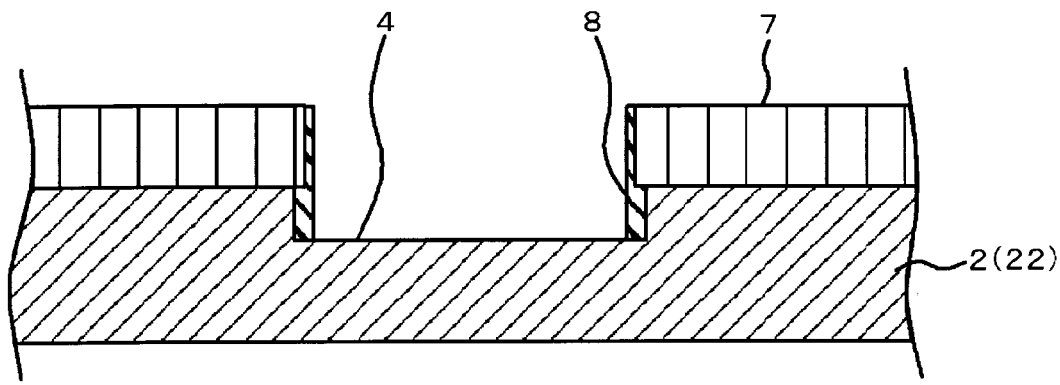

A mechanism of forming the reversely-tapered profile of the recesses 4 will be explained. Since the isotropic etching is adopted herein, the recesses 4 are etched not only at the bottoms thereof, but also on the side walls thereof (FIG. 5). The etching product 8 adheres on the inner circumference of the recess 4 (FIG. 6). However, the etching product does not remain on the bottom of the recess 4, since it is mechanically removed by collision of accelerated etchants, and consequently remains only on the side walls of the recess 4 as illustrated in FIG. 6. The etching product 8 is inert to the etching gas, and can thereby function as a mask for the etching.

Figure 7:
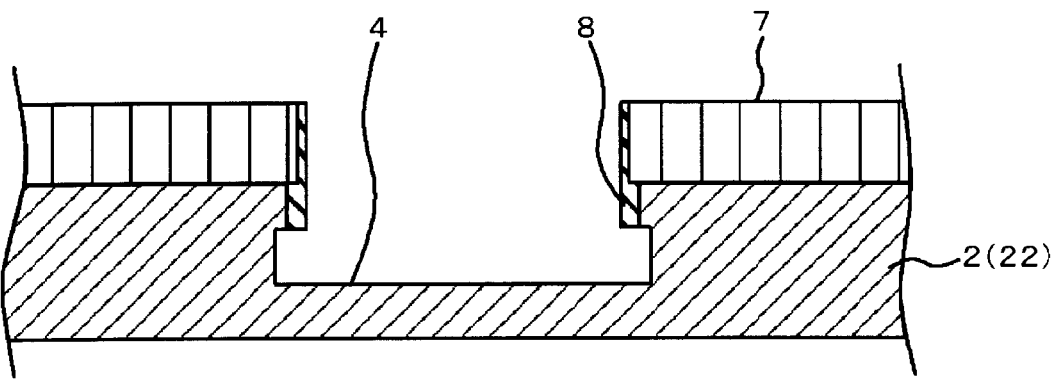
Figure 8:
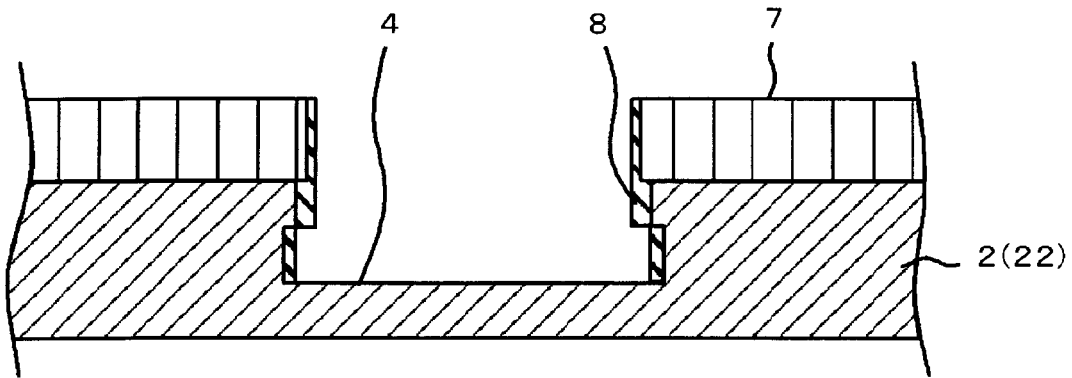
Figure 9:
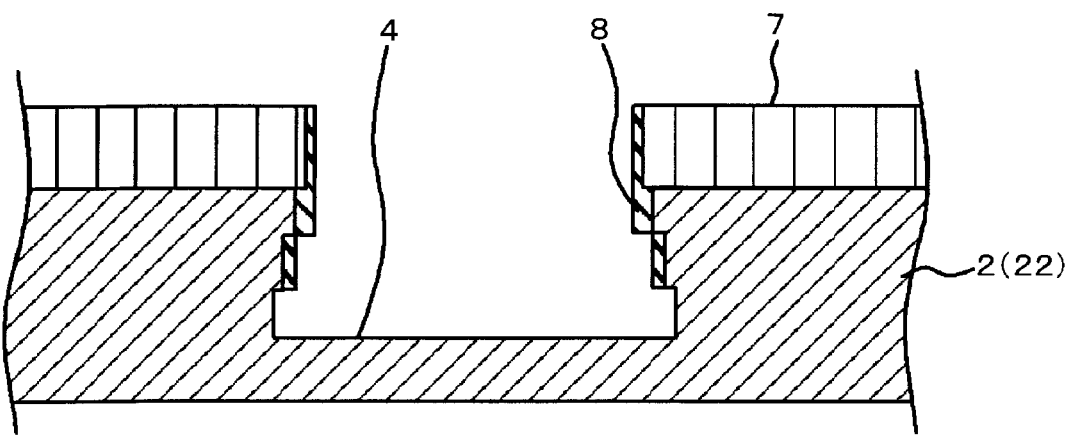

In a succeeding process of etching, the bottom of the recess 4, and the side wall portions only in the vicinity of the bottom, not yet covered by the etching product 8, are etched (FIG. 7). The etching product 8 adheres also on the side wall portions in the vicinity of the bottom (FIG. 8). In the process of etching further succeeded thereafter, the bottom of the recess 4, and the side wall portions only in the vicinity of the bottom, not yet covered by the etching product 8, are etched (FIG. 9). Similar actions are repeated over the duration of etching succeeded thereafter, and thereby the recess 4 having a profile such as being increased in the lateral width towards the deeper side, is formed. More specifically, the recess 4 is formed to have a reversely-tapered profile as illustrated in FIG. 1 and FIG. 3. Although the profile of the recesses 4 illustrated in FIG. 7 to FIG. 9 are step-wisely changed in the width for the simplicity of understanding, the profile of the recesses 4 actually achieved is the reversely-tapered profile as illustrated in FIG. 1 and FIG. 3, since the etching proceeds in a continuous manner, but not in a step-wise manner.

Exemplary conditions for the etching will now be explained. (1) For an exemplary case where the surface electrode 22 composed of an aluminum alloy film (AlCu, AlSiCu and so forth) is etched, isotropic etching may be proceeded while allowing the etching product 8 to deposit on the side walls produced by the etching, by using, for example, a mixed gas containing $CCl_4$ (carbon tetrachloride) and oxygen, as an etching gas. Addition of oxygen herein contributes to promote generation and deposition of the etching product 8. (2) Alternatively, also isotropic sputter-etching with the aid of an oxygen plasma may be preferable. In this case, the recesses 4 having the reversely-tapered profile may be formed while allowing the etching product 8 to deposit, by making oxygen, which is an etchant, obliquely incident on the surface to be etched.

After the recess 4 is formed, the mask pattern 7 is removed. Next, the leads 5 and the surface electrode 22 are electrically connected through wires 6.

Next, the semiconductor chip 2 is covered and encapsulated by the encapsulation resin 3. In this process, a resin which composes the encapsulation resin 3, and before being cured, enters the recesses 4, and cured after being fully anchored into the recesses 4. In this way, the encapsulation resin 3 in the recesses 4, and the portion of the surface electrode 22 around the recesses 4 are engaged with each other, as illustrated in FIG. 1 and FIG. 3.

According to the first embodiment described in the above, the semiconductor chip 2 has the recesses 4 formed in the surficial portion thereof, and each recess 4 has, on the deeper side of a predetermined portion thereof, a portion having a larger width than the predetermined portion has. In other words, the profile of the recess 4 is such as resisting against force, which is exerted so as to draw the semiconductor chip 2 and the encapsulation resin 3 apart from each other, in the direction normal to the surface of the semiconductor chip 2. Anchoring of the encapsulation resin 3 into the recess 4 makes the encapsulation resin 3 and the semiconductor chip 2 engage with each other. Since a large bonding force between the semiconductor chip 2 and the encapsulation resin 3 may be obtained, so that the adhesiveness between the semiconductor chip 2 and the encapsulation resin 3 may be improved. More specifically, a performance of ensuring a sufficient level of adhesiveness between the semiconductor chip 2 and the encapsulation resin 3 may particularly be enhanced, even if the stress is exerted in the direction normal to the surface of the semiconductor chip 2.

Since each recess 4 has the portion having a larger width than the opening end 41 has, on the deeper side of the opening end 41, so that the above-described resistance may be expressed at least at around the opening end 41.

Since each recess 4 has, at least in a portion thereof, a profile which increases in the width towards the deeper side, so that a strong force of engagement with the encapsulation resin 3 may be obtained at that portion. In particular in this embodiment, since each recess 4 has a profile increased in the width over the entire depth thereof, so that a strong force of engagement with the encapsulation resin 3 may be obtained over the entire portion of the recess 4.

Since the portion increased in the width towards the deeper side has the reversely-tapered profile, the recesses 4 may be formed by a single run of etching by appropriately selecting the etching conditions.

SECOND EMBODIMENT

In contrast to the recesses 4 having the reversely-tapered profile in the first embodiment, a second embodiment will now explain other exemplary profiles of the recesses 4. FIG. 10 to FIG. 15 are sectional end elevations of the profiles of the recesses 4 explained in the second embodiment. Features of the profiles of the individual recesses 4 will be explained.

Figure 10:
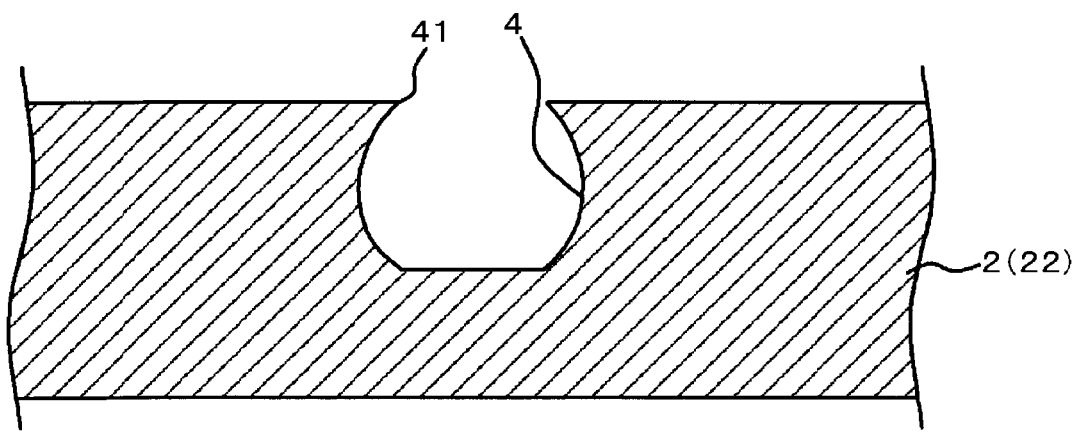
FIG. 10 to FIG. 15 are sectional end elevations of the profiles of the recesses explained in a second embodiment.

The recess 4 illustrated in FIG. 10 has a profile once increased in the width when viewed from the opening end to the bottom, and again decreased in the width. Also the profile of the recess 4 illustrated in FIG. 10 may be achievable by appropriately adjusting the etching conditions.

Figure 11:
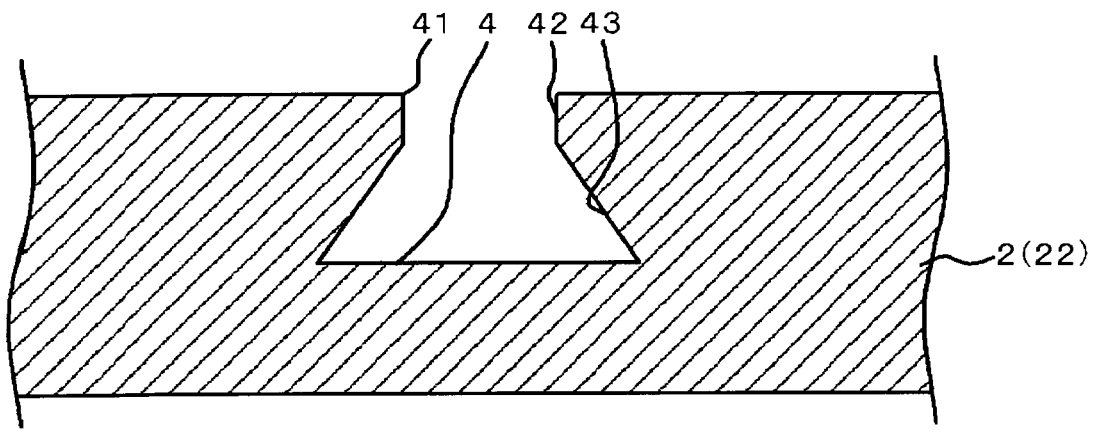

The recess 4 illustrated in FIG. 11 has a constant-width portion 42 which has a constant width irrespective of the depth, and a reversely-tapered portion 43 which is formed on the deeper side than the constant-width portion 42 so as to communicate therewith. The width of the reversely-tapered portion 43 at the shallowest portion thereof equals to the width of the constant-width portion 42. The recess 4 having the profile illustrated in FIG. 11 may be formed typically by configuring the surface electrode 22 using two separate layers. More specifically, a first layer allowing therein formation of the reversely-tapered portion 43 is formed first, and the reversely-tapered portion 43 is formed in the first layer similarly as described in the first embodiment. Next, a mask pattern which fills the reversely-tapered portion 43 is formed.

Next, a second layer allowing therein formation of the constant-width portion 42 is formed on the first layer and the mask pattern. Next, the constant-width portion 42 is formed in the second layer, according to etching conditions capable of making the side walls of the recess 4 upright. Next, the mask pattern remained in the reversely-tapered portion 43 is removed through the constant-width portion 42. The recess 4, having the profile illustrated in FIG. 11, raises an effect of enhancing the strength of the portion around the opening of the recess 4 as compared with the first embodiment, by virtue of the extra thickness contributed by the constant-width portion 42.

Figure 12:
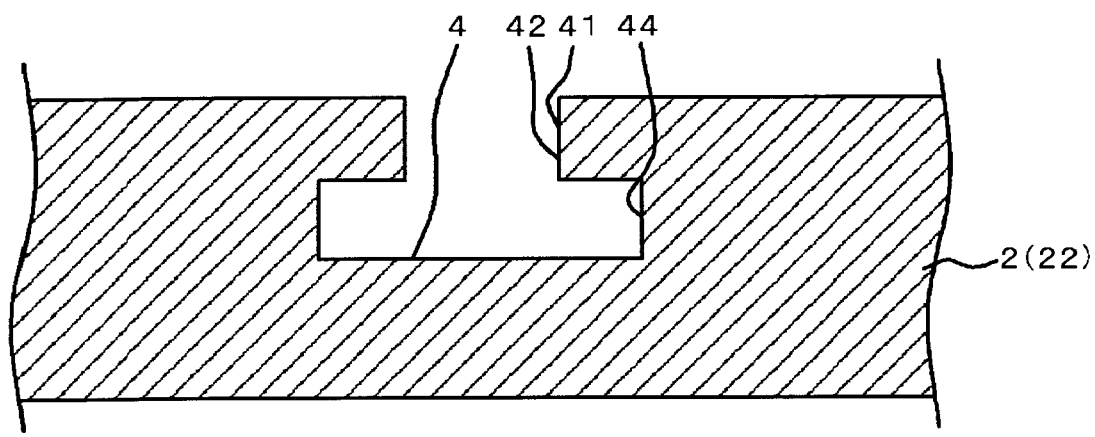

The recess 4 illustrated in FIG. 12 is step-wisely varied in the width thereof, to have a plurality of levels of width (two levels, for example). More specifically, the recess 4 in this case has the constant-width portion 42 having a first width, and a constant-width portion 44 having a second width, which is formed on the deeper side of the constant-width portion 42 so as to communicate therewith. The second width is larger than the first width. Also the recess 4 having the profile illustrated in FIG. 12 may be formed typically by configuring the surface electrode 22 using two separate layers, similarly to the case of the recess 4 illustrated in FIG. 11. More specifically, the first layer allowing therein formation of the constant-width portion 44 having the second width is formed, and the constant-width portion 44 is then formed in the first layer, according to etching conditions capable of making the side walls upright. A mask pattern which fills the constant-width portion 44 is then formed. Next, a second layer allowing therein formation of the constant-width portion 42 is formed on the first layer and the mask pattern. Next, the constant-width portion 42 is formed in the second layer, according to etching conditions capable of making the side walls upright. Next, the mask pattern remained in the constant-width portion 44 is removed through the constant-width portion 42. Also the recess 4, having the profile illustrated in FIG. 12, raises an effect of enhancing the strength of the portion around the opening of the recess 4 as compared with the first embodiment, by virtue of the extra thickness contributed by the constant-width portion 42.

Figure 13:
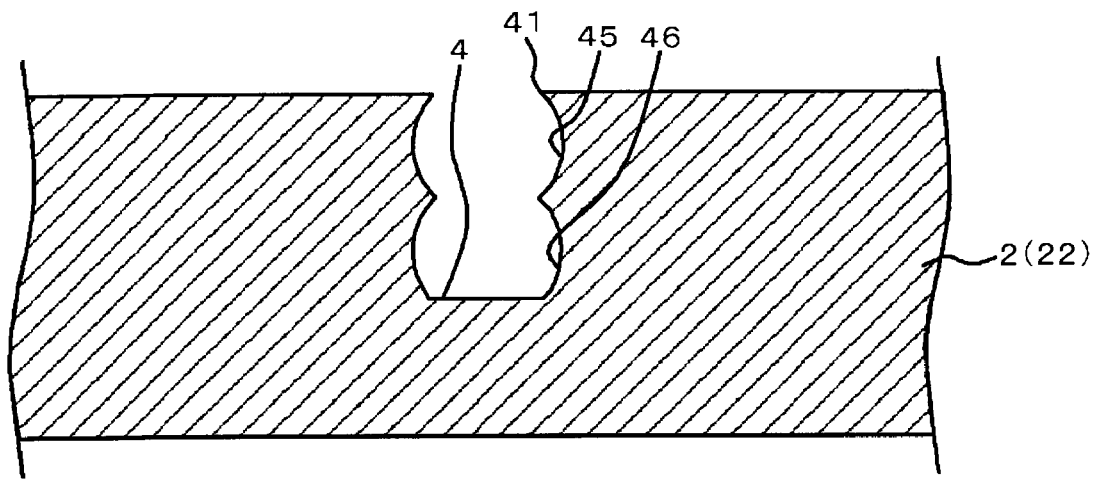

The recess 4 illustrated in FIG. 13 has a profile obtainable by doubly stacking the recess 4 illustrated in FIG. 10. Also the recess having the profile illustrated in FIG. 13 may be formed typically by configuring the surface electrode 22 using two separate layers. More specifically, the first layer allowing therein formation of the lower half 46 of the recess 4 is formed, and the lower half 46 is then formed in the first layer, by appropriately adjusting the etching conditions. A mask pattern which fills the lower half 46 is then formed. Next, a second layer allowing therein formation of the upper half 45 of the recess 4 is formed on the first layer and the mask pattern. Next, the upper half 45 is formed in the second layer, by appropriately adjusting the etching conditions. Next, the mask pattern remained in the lower half 46 is removed through the upper half 45. In the recess 4 having a profile illustrated in FIG. 13, there are two positions in the depthwise direction thereof capable of exerting resistance against the encapsulation resin 3. More specifically, a portion in the vicinity of the opening end 41, and a portion in the vicinity of the boundary between the upper half 45 and the lower half 46 respectively engage with the encapsulation resin 3.

The recesses 4 in all examples described in the above satisfy the condition stating that "the recess 4 has a portion having a larger width than the opening end 41 has, on the deeper side than the opening end 41". The profile of the recess 4 is, however, not limited thereto, and instead allows some profiles departing from the condition, typically as illustrated in FIG. 14 and FIG. 15.

Figure 14:
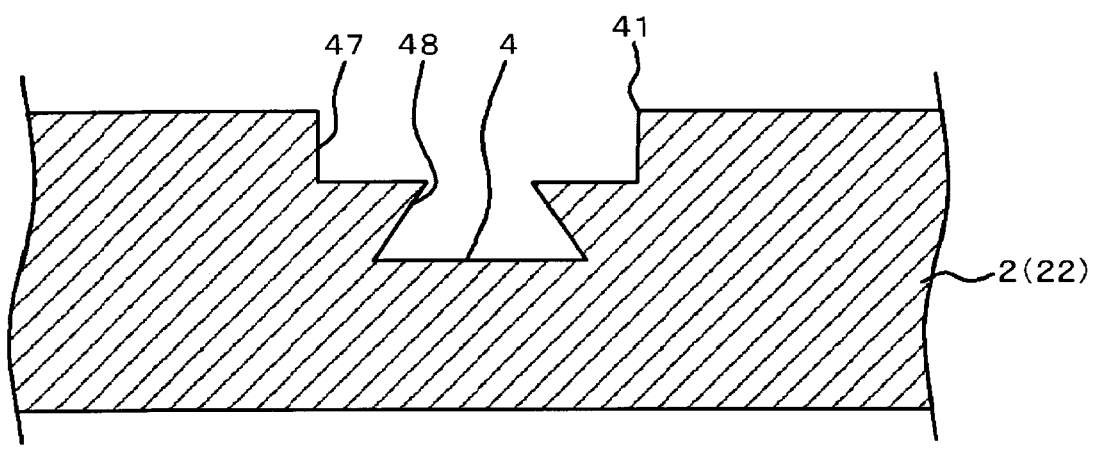

The recess 4 illustrated in FIG. 14 has a constant-width portion 47 which has a constant width irrespective of the depth, and a reversely-tapered portion 48 which is formed on the deeper side of the constant-width portion 47 so as to communicate therewith. The width of the constant-width portion 47 is set larger than the width of the deepest portion of the reversely-tapered portion 48 (that is, the portion having a maximum width). Also the recess 4 having the profile illustrated in FIG. 14 may be formed typically by configuring the surface electrode 22 using two separate layers. More specifically, the first layer allowing therein formation of the reversely-tapered portion 48 is formed, and the reversely-tapered portion 48 is then formed in the first layer. A mask pattern which fills the reversely-tapered portion 48 is then formed. Next, a second layer allowing therein formation of the constant-width portion 47 is formed on the first layer and the mask pattern. Next, the constant-width portion 47 is formed in the second layer, according to etching conditions capable of making the side walls upright. Next, the mask pattern remained in the reversely-tapered portion 48 is removed through the constant-width portion 47.

Figure 15:
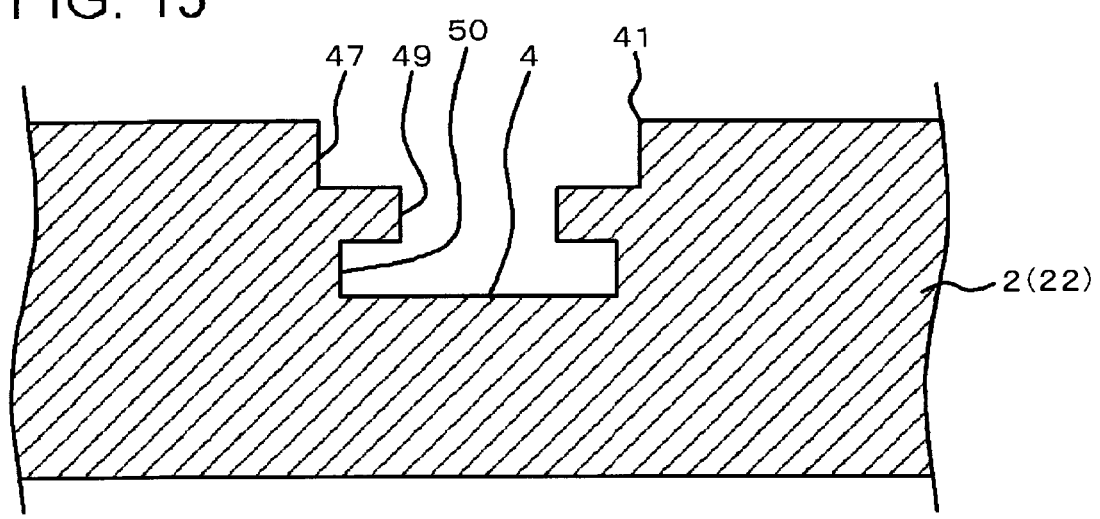

The recess 4 illustrated in FIG. 15 has three constant-width portions 47, 49 and 50, each of which respectively having a constant width irrespectively of the depth, provided in this order while being communicated in sequence. Of these portions, the constant-width portion 47 in the shallowest position has a largest width, the constant-width portion 50 in the deepest position has a second largest width, and the constant-width portion 49 in the middle position has a smallest width. The recess 4 having a profile illustrated in FIG. 15 may be formed typically by configuring the surface electrode 22 using three separate layers. More specifically, the first layer allowing therein formation of the constant-width portion 50 is formed, and the constant-width portion 50 is then formed in the first layer, according to etching conditions capable of making the side walls upright. A mask pattern which fills the constant-width portion 50 is then formed. Next, a second layer allowing therein formation of the constant-width portion 49 is formed on the first layer and the mask pattern. The constant-width portion 49 is then formed in the second layer, according to etching conditions capable of making the side walls upright. A mask pattern which fills the constant-width portion 49 is then formed. Next, a third layer allowing therein formation of the constant-width portion 47 is formed on the second layer and the mask pattern. The constant-width portion 47 is then formed in the third layer, according to etching conditions capable of making the side walls upright. Next, the mask patterns remained in the constant-width portions 49, 50 are removed through the constant-width portion 47.

All recesses 4 illustrated in FIG. 10 to FIG. 15 satisfy the condition stating that "on the deeper side than a predetermined portion in the recess 4, a portion having a larger width than the predetermined portion has is formed".

The recesses 4 which satisfy the condition stating that "the recess 4 has a portion having a larger width than the opening end 41 has, than the deeper side of the opening end 41" are those illustrated in FIG. 10 to FIG. 13. The recesses illustrated in FIG. 14 and FIG. 15 do not satisfy the condition.

The recesses illustrated in FIGS. 10, 11, 13 and 14 also satisfy the condition stating that "the recess 4 has, at least in a portion thereof, a profile which increases in the width towards the deeper side". Of these recesses 4, those illustrated in FIGS. 11 and 14 also satisfy the condition stating that "the profile which increases in the width towards the deeper side is a reversely-tapered profile".

The recesses 4 illustrated in FIGS. 11, 12 and 15 also satisfy the condition stating that "the predetermined portion has a constant width irrespective of the depth". The recesses 4 illustrated in FIGS. 12 and 15 also satisfy the condition stating that "the portion having a larger width has a constant width irrespective of the depth".

According to the second embodiment, the effects similar to those in the first embodiment may be obtained.

Figure 16:
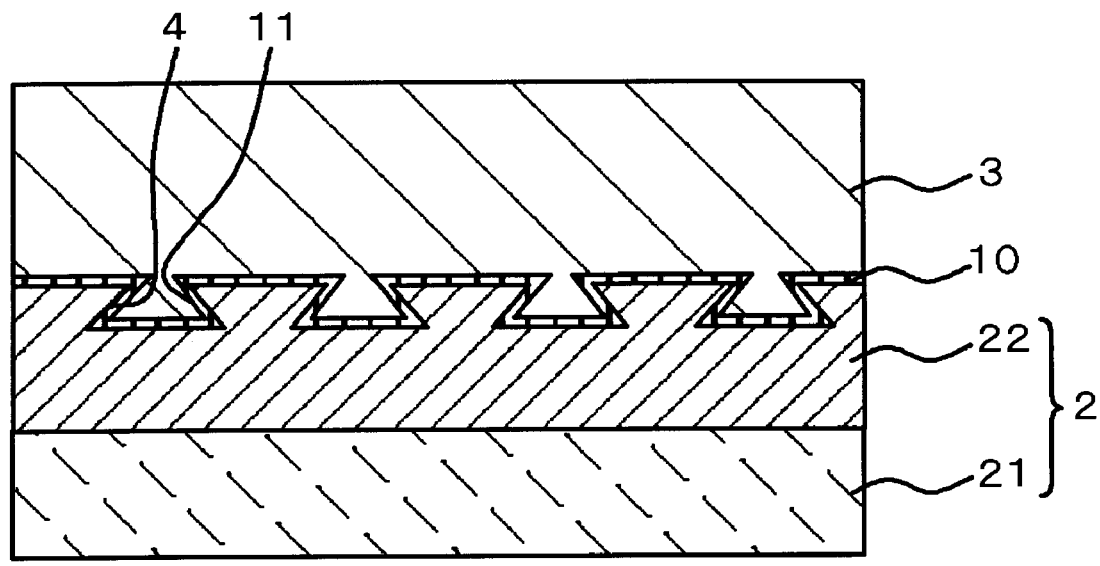
FIG. 16 is an enlarged view illustrating an essential portion of an exemplary configuration having a protective film formed on a surface electrode.
Figure 17:
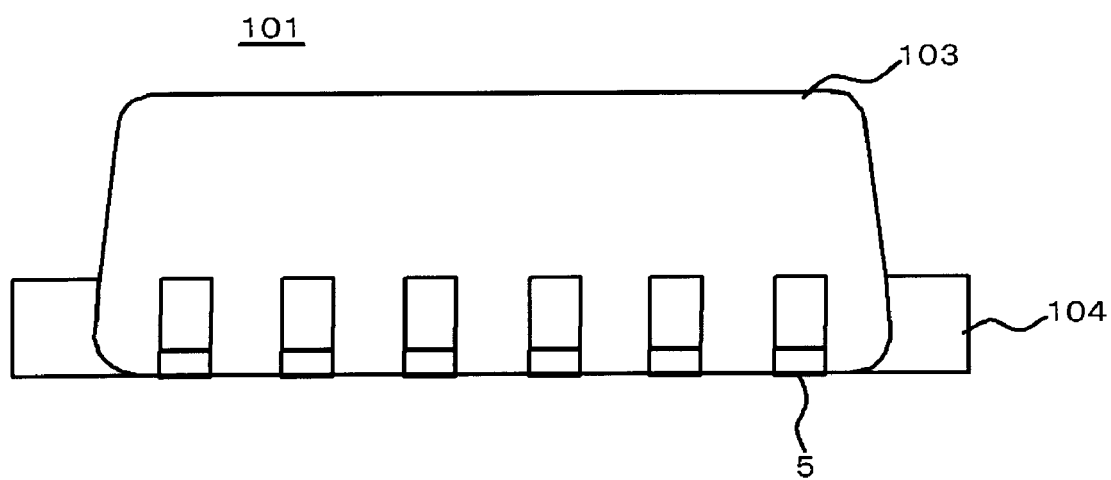
FIG. 17 is a front elevation illustrating a resin-encapsulated semiconductor device.
Figure 18:
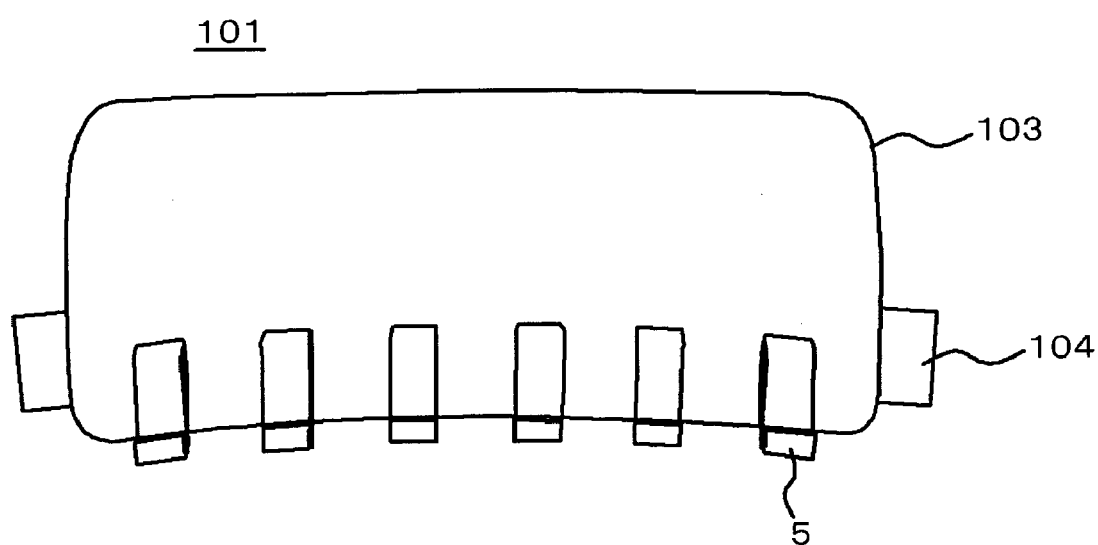
FIG. 18 is a front elevation illustrating a state of the semiconductor device illustrated in FIG. 17, warped due to stress.
Figure 19:
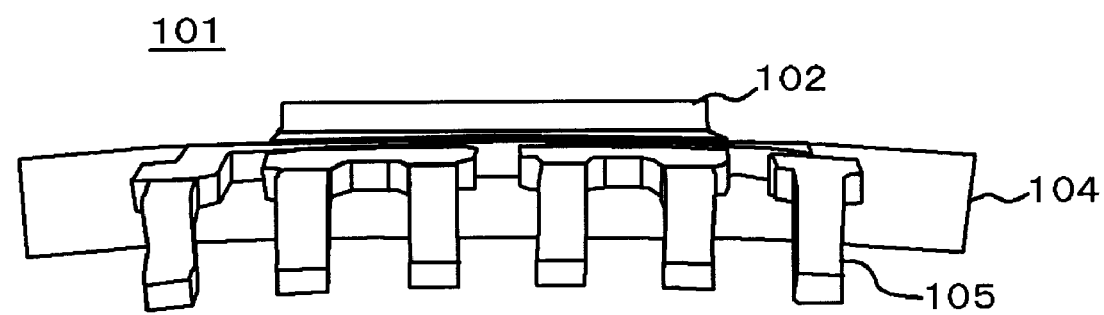
FIG. 19 is a front elevation of the semiconductor device illustrated in FIG. 18, having an encapsulation resin removed therefrom.

Although the embodiments in the above explained the cases where the surface electrode 22 and the encapsulation resin 3 were directly brought into contact with each other, the surface electrode 22 and the encapsulation resin 3 may alternatively be stacked while placing a thin film in between, as illustrated in FIG. 16. More specifically, in an exemplary case illustrated in FIG. 16, a protective film 10 is formed as the thin film on the surface electrode 22, conforming to the surface profile of the surface electrode 22. Since the protective film 10 conforms to the surface profile of the surface electrode 22, so that the surface of the protective film 10 configures recesses 11 having a similar figure. The encapsulation resin 3 anchors into the recesses 11, and thereby the encapsulation resin 3 and the semiconductor chip 2 engage with each other.

Although the embodiments in the above explained the cases where the recesses 4 were formed in the surface electrode 22, the recesses 4 may alternatively be formed in portions other than the surface electrode 22, so far as the portions are surficial portions of the semiconductor chip 2 possibly be covered with the encapsulation resin 3. Also in these cases, the recesses 4 may preferably be formed in a metal film (metal layer) which is formed on the surface of the semiconductor chip 2 similarly to the above-described surface electrode 22.

It is apparent that the present invention is not limited to the above embodiments, that may be modified and changed without departing from the scope and spirit of the invention.

What is claimed is:

1. A semiconductor device comprising:
   a semiconductor chip comprising a surface metal electrode formed thereon;
   a lead;
   a wire electrically connected between said surface metal electrode and said lead; and
   an encapsulation resin which covers and encapsulates said semiconductor chip with said surface metal electrode, said wire and an inner part of said lead,
   wherein said surface metal electrode is shaped to have a recess formed in a surficial portion thereof,
   said recess formed in said surface metal electrode comprising a narrower portion and a wider portion located below said narrower portion in said recess, and
   said encapsulation resin is anchored in said narrower and wider portions of said recess so that said encapsulation resin and said semiconductor chip are engaged with each other.

2. The semiconductor device as claimed in claim 1, wherein said wider portion has a larger width than an opening end of said recess has, on the deeper side than said opening end.

3. The semiconductor device as claimed in claim 1, wherein said recess has, at least in a portion thereof, a profile which increases in the width towards the deeper side.

4. The semiconductor device as claimed in claim 1, wherein said recess has, over the entire portion thereof, a profile which increases in the width towards the deeper side.

5. The semiconductor device as claimed in claim 3, wherein said recess has a reversely-tapered profile.

6. The semiconductor device as claimed in claim 1, wherein said narrower portion has a constant width irrespective of the depth.

7. The semiconductor device as claimed in claim 1, wherein said wider portion has a constant width irrespective of the depth.

8. A method of manufacturing a semiconductor device comprising:
   forming a recess in a surficial portion of a surface metal electrode formed on a semiconductor chip;
   electrically connecting between said surface metal electrode and a lead with a wire; and
   encapsulating said semiconductor chip with an encapsulation resin,
   wherein in said forming a recess, said recess is formed to comprise a narrower portion and a wider portion located below said narrower portion in said recess, and
   in said encapsulating said semiconductor chip, said encapsulation resin and said semiconductor chip are engaged with each other by anchoring said encapsulation resin into said narrower and wider portions of said recess.

9. The semiconductor device as claimed in claim 3, wherein said recess has, at least in another portion thereof, a profile which decreases in the width towards the deeper side.

10. The method as claimed in claim 8, wherein said narrower portion has a constant width irrespective of the depth.

11. The method as claimed in claim 8, wherein said wider portion has a constant width irrespective of the depth.

* * * * *

UNITED STATES PATENT AND TRADEMARK OFFICE
CERTIFICATE OF CORRECTION

PATENT NO. : 8,350,392 B2
APPLICATION NO. : 12/689680
DATED : January 8, 2013
INVENTOR(S) : Hirotomo Yanagisawa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 306 days.

Signed and Sealed this
Thirtieth Day of July, 2013

Teresa Stanek Rea
*Acting Director of the United States Patent and Trademark Office*